United States Patent
Chen et al.

(10) Patent No.: US 11,346,019 B2
(45) Date of Patent: May 31, 2022

(54) QUASI-SINGLE-CRYSTAL FILM AND MANUFACTURING METHOD THEREOF

(71) Applicant: NATIONAL CHIAO TUNG UNIVERSITY, Hsinchu (TW)

(72) Inventors: Chih Chen, Hsinchu (TW); Yu-Jin Li, Hsinchu (TW)

(73) Assignee: National Chiao Tung University, Hsinchu (TW)

(*) Notice: Subject to any disclaimer, the term of this patent is extended or adjusted under 35 U.S.C. 154(b) by 101 days.

(21) Appl. No.: 16/939,566

(22) Filed: Jul. 27, 2020

(65) Prior Publication Data
US 2021/0032774 A1   Feb. 4, 2021

(30) Foreign Application Priority Data
Jul. 30, 2019   (TW) ................... 108126890

(51) Int. Cl.
*C30B 29/66*   (2006.01)
*C30B 1/00*   (2006.01)
(Continued)

(52) U.S. Cl.
CPC ............... *C30B 29/66* (2013.01); *C30B 1/00* (2013.01); *C30B 29/02* (2013.01); *C30B 29/68* (2013.01)

(58) Field of Classification Search
CPC .. C30B 1/00; C30B 1/12; C30B 29/02; C30B 29/66; C30B 29/68
See application file for complete search history.

(56) References Cited

U.S. PATENT DOCUMENTS 5,308,723 A * 5/1994 Inoue ................ C22C 38/08
                                                  430/23
5,503,693 A * 4/1996 Inoue ................ C21D 8/0205
                                                  148/621
(Continued)

FOREIGN PATENT DOCUMENTS

CN   103732768 A   4/2014
CN   107354506 A   11/2017
(Continued)

OTHER PUBLICATIONS

Examination Report for counterpart Chinese Application No. 202010737961.6, dated Apr. 15, 2021.
(Continued)

*Primary Examiner* — Robert M Kunemund
(74) *Attorney, Agent, or Firm* — Rosenberg, Klein & Lee

(57) ABSTRACT

A quasi-single-crystal film and its manufacturing method thereof are provided, in which a metal film having a preferred orientation of <111> on its surface is subjected to a mechanical stretching force, such that the crystal grains thereof are able to form in a much more orderly arrangement, and a quasi-single-crystal film having preferred orientations on three axes can be obtained. The proposed quasi-single-crystal film has preferred orientations of <211> and <110> on its stretching direction and a direction that is perpendicular to the stretching direction, respectively, and retains a preferred orientation of <111> on its surface. By employing the present invention, it is advantageous of manufacturing large-area quasi single crystal films having high anisotropy as well as growing two dimensional materials or developing of other anisotropic feature structures.

12 Claims, 4 Drawing Sheets

(51) Int. Cl.
*C30B 29/02* (2006.01)
*C30B 29/68* (2006.01)

(56) References Cited

U.S. PATENT DOCUMENTS

| | | | | |
|---|---|---|---|---|
| 5,605,581 | A * | 2/1997 | Inoue | C21D 8/0205 148/310 |
| 5,607,899 | A | 3/1997 | Yoshida et al. | |
| 5,628,841 | A * | 5/1997 | Inoue | C21D 8/0205 148/120 |
| 6,103,394 | A * | 8/2000 | Okuda | B21D 22/20 148/320 |
| 6,180,570 | B1 | 1/2001 | Goyal | |
| 6,740,421 | B1 | 5/2004 | Goyal | |
| 7,078,108 | B2 | 7/2006 | Zhang et al. | |
| 7,087,113 | B2 | 8/2006 | Goyal | |
| 8,221,897 | B2 * | 7/2012 | Muroga | H05K 1/09 428/606 |
| 10,094,033 | B2 | 10/2018 | Chen et al. | |
| 10,626,485 | B2 * | 4/2020 | Obata | C22C 38/00 |
| 2004/0195105 | A1 | 10/2004 | Yoo et al. | |
| 2008/0113455 | A1 | 5/2008 | Jain et al. | |
| 2009/0173414 | A1 * | 7/2009 | Muroga | C22C 9/00 148/432 |
| 2010/0291402 | A1 | 11/2010 | Muroga et al. | |
| 2016/0168746 | A1 | 6/2016 | Chen et al. | |
| 2016/0355940 | A1 | 12/2016 | Chen et al. | |

FOREIGN PATENT DOCUMENTS

| | | |
|---|---|---|
| CN | 107904654 A | 4/2018 |
| CN | 109652858 A | 4/2019 |
| TW | I432613 B | 4/2014 |
| TW | 201621091 A | 6/2016 |

OTHER PUBLICATIONS

Liu, et al., "Fabrication and Characterization of (111)-Oriented and Nanotwinned Cu by Dc Electrodeposition", Crystal Growth & Design, 12.10 (2012): 5012-5016.
Huang, Yi-Sa, et al., "Grain Growth in Electroplated (1 1 1)-Oriented Nanotwinned Cu", Scripta Materialia 89 (2014):5-8.
Lu, Chia-Ling, et al., "Extremely Anisotropic Single-Crystal Growth in Nanotwinned Copper", NPG, Asia Materials 6.10 (2014): e135.
Examination Report for counterpart Chinese Application No. 201910789903.5, dated Nov. 25, 2020.
Examination Report for counterpart Taiwanese Application No. 109125290, dated Dec. 24, 2020.
Field, et al. "Electron Backscatter Diffraction Characterization of Inlaid Cu Lines for Interconnect Applications." Scanning, 25(6) (Nov. 2003), pp. 309-315. doi: 10.1002/sca.4950250607.
Examination Report for corresponding TW Patent Application 108126890.
"Electron Backscatter Diffraction Characterization of Inlaid Cu Lines for Interconnect Applications", by D. P. Field, T. Muppidi, J. E. Sanchez, Jr., received on Jun. 20, 2003 and accepted by Sep. 9, 2003, (Scanning vol. 25, 309-315).

* cited by examiner

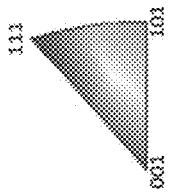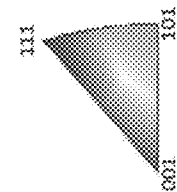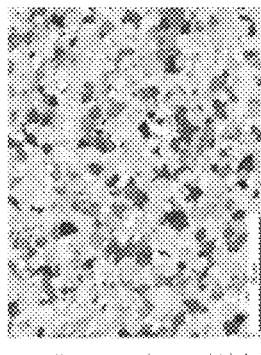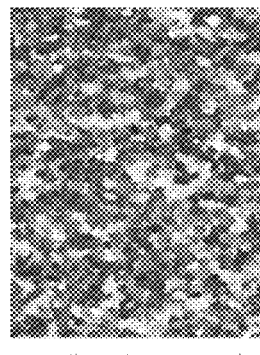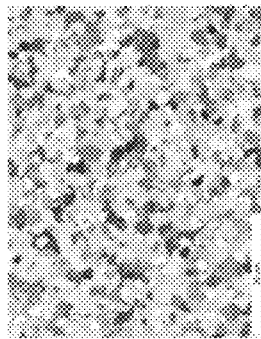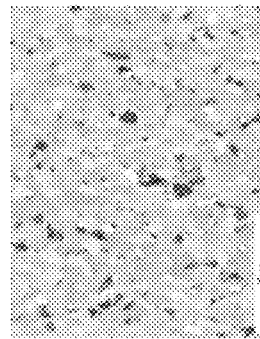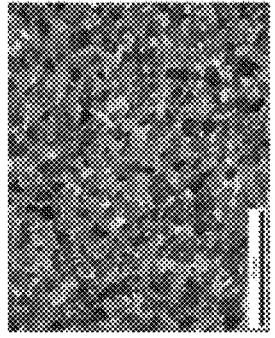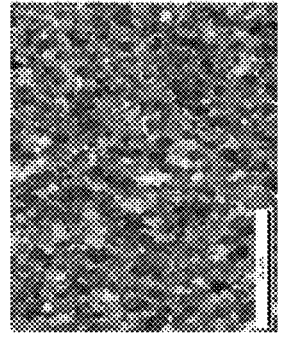
Fig. 3a  Fig. 3b  Fig. 3c  Fig. 3d  Fig. 3e  Fig. 3f

QUASI-SINGLE-CRYSTAL FILM AND MANUFACTURING METHOD THEREOF

This application claims priority for Taiwan patent application no. 108126890 filed on 30 Jul. 2019, the content of which is incorporated by reference in its entirely.

BACKGROUND OF THE INVENTION

Field of the Invention

The present invention relates to a metal film growth technique, and more particularly to a quasi-single-crystal film having extraordinary preferred orientations on three axes and its manufacturing method thereof.

Description of the Prior Art

In a conventional field for preparing materials of metal film having preferred orientations, epitaxy, electroplate growth, deformation, and heat treatment methods are the most commonly used.

For example, in some studies, such as U.S. Pat. No. 10,094,033, an electroplating plated nano-twins copper film having a growth height of <111> preferred orientation may be manufactured by employing an electroplating process, and the electroplating plated nano-twins copper film is able to show superior thermal stability. Also, it effectively transforms the disordered grains into columnar nano-twins copper ones, and the <111> nano-twins copper grown by employing such technique is able to turn into the preferred orientation of <100> after annealing. Nevertheless, such technique so far is known as not being able to effectively control the other preferred orientations rather than the film surface itself.

While considering some other preparation methods, an U.S. Publication. No. 20100291402 discloses a rolled copper foil made of a tough pitch copper applied with a recrystallization annealing, in which Tin must be doped so as to generate preferred orientations on its rolling surface. An U.S. Pat. No. 7,078,108 discloses a magnetron sputtering method for fabricating copper foil having a preferred orientation of <111> on its surface. However, it cannot be utilized into mass production. Another U.S. Publication No. 20040195105 discloses using a variety of waveforms, comprising digital current, pulse, and periodic negative currents to directly fabricate a quasi-single-crystal copper film having a controlled surface orientation of <100>. An U.S. Pat. No. 5,607,899 discloses using a laser-excited target to deposit a single crystal metal film on a substrate, which is able to control the preferred orientation on its surface as well. However, such technique must be performed in a vacuum environment and cannot be brought into mass production. An U.S. Pat. No. 6,180,570 discloses depositing a metal film on a tubular preformed material, in which biaxial preferred orientation can be retrieved through a series of plastic deformation and recrystallization. However, the biaxial preferred orientations can only be achieved when the deformable tubular preformed material and the metal film are in plastic deformation and annealing together, whereby is being limited in application. Another U.S. Pat. No. 7,087,113 disclose utilizing deformation to recrystallize for forming a single crystal or subboundary, in which its material must be heated over a second recrystallization or to anneal at a temperature which is higher than the secondary recrystallization temperature from a seed crystal having preferred orientation so as to completely transform the material into a single crystal. Taking copper as an example, then the process temperature would be approximately 600 Celsius degrees. Another U.S. Pat. No. 6,740,421 proposes to fabricate a substrate having biaxial preferred orientations by rolling, and then an epitaxial process can directly take place and deposit film on such substrate having biaxial preferred orientations.

However, it draws our attention that among these prior arts, there still exist the following three major drawbacks:
(1) The epitaxial process was slow, the production cost was too high, and thus in lack of production potential.
(2) The process for depositing quasi single crystals can only control the preferred orientation of its surface, and cannot control the preferred properties of other orientations.
(3) In conventional techniques, preferred orientations on three axes can only be achieved by performing annealing up to the recrystallization temperature after deformation, nevertheless, a (111) surface is still not created or maintained.

Therefore, on account of above, to overcome the above mentioned problems, it should be obvious that there is indeed an urgent need for the professionals in the field for a novel and inventive quasi-single-crystal film having extraordinary preferred orientations on three axes to be developed that can effectively solve those above mentioned problems occurring in the prior design. And its manufacturing method must meet the requirements of high-speed, low-cost production of a large number of products to make it valuable when being brought into application.

SUMMARY OF THE INVENTION

In order to overcome the above mentioned disadvantages, one major objective in accordance with the present invention is provided for a novel quasi-single-crystal film and its manufacturing method thereof. By employing a mechanical stretching force, a metal film having a preferred orientation of <111> is plastically deformed, such that another specific preferred orientations along the stretching direction and a direction that is perpendicular to the stretching direction can also be obtained, whereby a quasi-single-crystal film having preferred orientations on three axes are accomplished.

In addition, another objective in accordance with the present invention is provided for the novel quasi-single-crystal film and its manufacturing method thereof. The quasi-single-crystal film and its manufacturing method are characterized by simple and rapid process flow and thus being beneficial to meet the requirements for mass production of the quasi-single-crystal film.

For achieving the above mentioned objectives, the present invention provides a quasi-single-crystal film comprising a plurality of crystal grains which are arranged closely. The crystal grains on more than 50 percent of an area of a surface of the quasi-single-crystal film have a preferred orientation of <111>, and after a mechanical stretching force is applied to the quasi-single-crystal film to make it plastically deformed, the crystal grains on more than 50 percent of the area of the quasi-single-crystal film have a preferred orientation of <211> along the stretching direction, and the crystal grains on more than 50 percent of the area of the quasi-single-crystal film have a preferred orientation of <110> along a direction that is perpendicular to the stretching direction.

In another aspect, the present invention also provides a manufacturing method for fabricating a quasi-single-crystal film, comprising the following steps. At first, a metal film, comprising a plurality of crystal grains which are arranged closely, is provided, wherein the crystal grains on more than 50 percent of an area of a surface of the metal film have a preferred orientation of <111>. Next, a mechanical stretching force is applied to the metal film along a stretching direction, such that the metal film is plastically deformed so as to obtain a quasi-single-crystal film. In addition to the crystal grains on more than 50 percent of the surface area of the metal film having a <111> preferred orientation, the crystal grains on more than 50 percent of the area of the quasi-single-crystal film have another preferred orientation of <211> along the stretching direction, and the crystal grains on more than 50 percent of the area of the quasi-single-crystal film have another preferred orientation of <110> along a direction that is perpendicular to the stretching direction.

In the embodiment of the present invention, the crystal grains of the quasi-single-crystal film have a diameter of about 1 to 5000 μm.

Furthermore, according to the quasi-single-crystal film and its manufacturing method provided by the present invention, when compared to the conventional quasi single crystal film manufacturing techniques, it is believed that two other orientations besides the surface itself of the metal film can be generated and texturing characteristics are shown after the metal film is plastically deformed. Meanwhile, the <111> preferred orientation on the surface itself is retained. As a result, the present invention is aimed to achieve the purpose of preferred orientations on three axes by merely plastically deforming the metal film. The proposed process is simple, rapid, low in cost, and highly efficient. Thus, it is able to meet the requirements for mass production, and helps to be widely applied in the industrial developments in the very near future.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIGS. 3a to 3f show orientation image maps (OIM) of the crystals through the electron back-scattered diffraction, (EBSD) in the nano-twins copper film before and after plastic deformation employed by the stretching process in accordance with an embodiment of the present invention.

DESCRIPTION OF THE PREFERRED EMBODIMENTS

Figure 1:
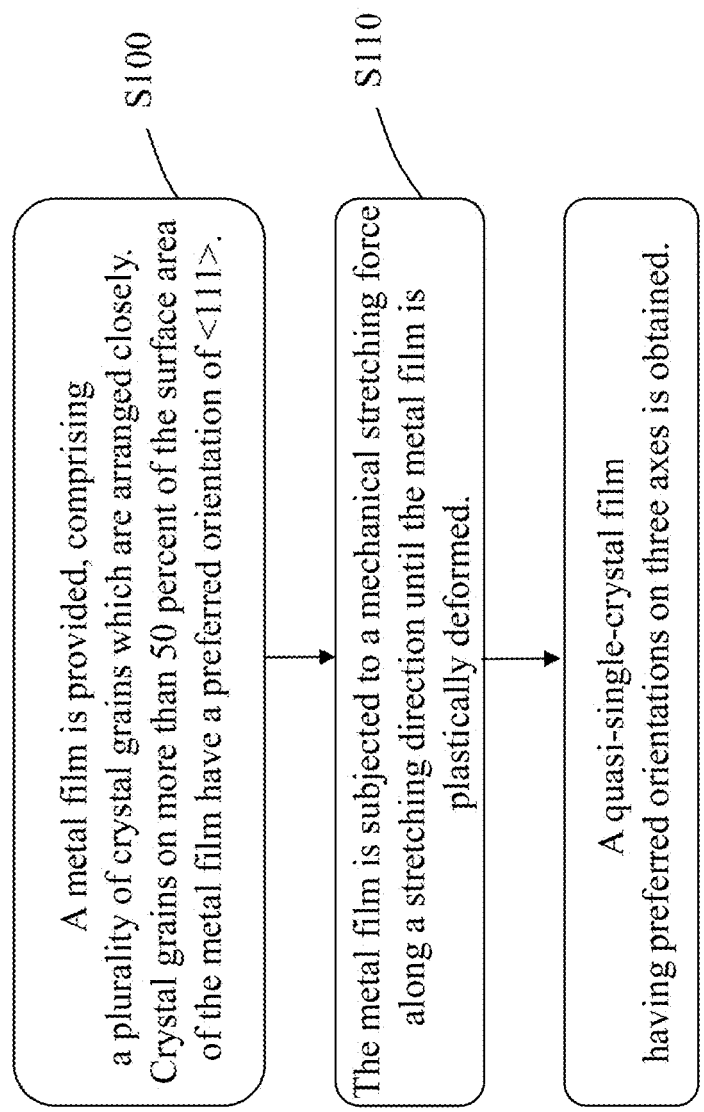
FIG. 1 shows a flow chart of a manufacturing method for fabricating a quasi-single-crystal film in accordance with a preferred embodiment of the present invention.

Please refer to FIG. 1, which shows a flow chart of a manufacturing method for fabricating a quasi-single-crystal film in accordance with a preferred embodiment of the present invention. The manufacturing method comprises the following steps.

Figure 2A:
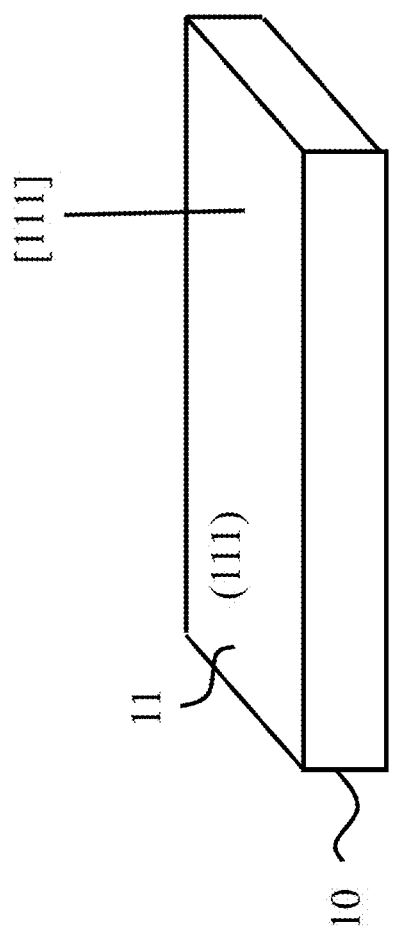
FIG. 2A shows a structural diagram of a metal film used in accordance with a preferred embodiment of the present invention.

At first, please refer to step S100. As shown in FIG. 2A, a metal film 10 is provided. And, the metal film 10 comprises a plurality of crystal grains which are arranged closely. Crystal grains on more than 50 percent of the area of the surface 11 of the metal film 10 have a preferred orientation of <111>. The surface 11 of the metal film 10 can be read as an upper surface and/or a lower surface.

According to the embodiment of the present invention, the surface 11 of the metal film 10 is a (111) crystal plane, the metal film 10 may comprise a plurality of columnar crystal structures, and a material of the metal film 10 may be selected from the group consisting of silver, copper, nickel, aluminum, palladium and magnesium.

In the embodiment of the present invention, the metal film 10 can be a nano-twins copper film composed of a plurality of nano-twins structures. The surface 11 is a (111) crystal plane, and the nano-twins copper film has a height of <111> preferred orientation and comprises nano-twins in high density. Hereinafter, its manufacturing method would be incorporated with the contents disclosed in the U.S. Pat. No. 10,094,033, as references made to the present invention.

Figure 2B:
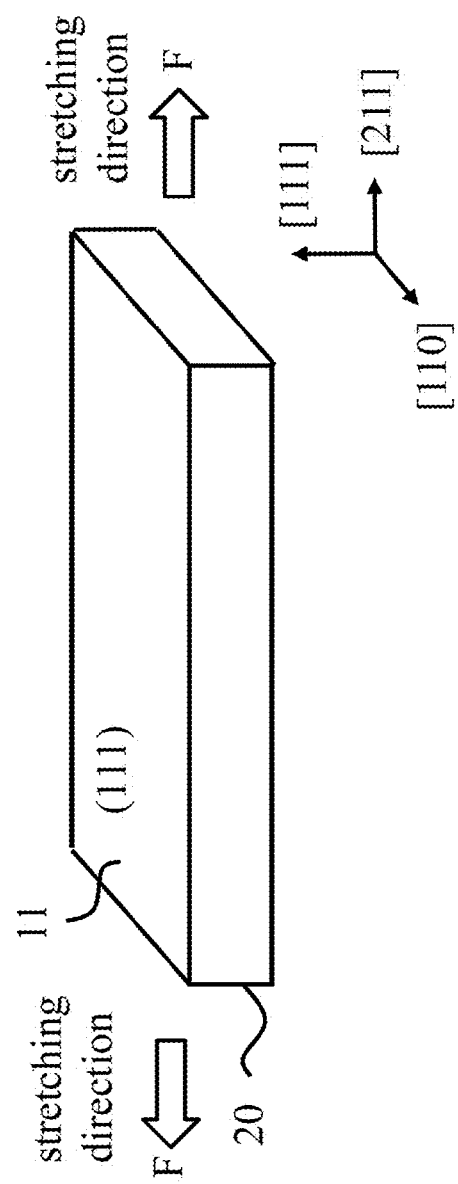
FIG. 2B shows a structural diagram of applying a mechanical stretching force to the metal film so as to generate a quasi-single-crystal film in accordance with a preferred embodiment of the present invention.

Then, please refer to step S110. As shown in FIG. 2B, the metal film 10 provided in FIG. 2A is subjected to a mechanical stretching force F at a normal or higher temperature until the metal film 10 is plastically deformed and the crystal grains of the metal film 10 start to rotate so as to form a much more orderly stack. At this time, a quasi-single-crystal film 20 having preferred orientations on three axes is obtained. In details, crystal grains on more than 50 percent of the area of the quasi-single-crystal film 20 have a preferred orientation of <211> along the stretching direction. Also, crystal grains on more than 50 percent of the area of the quasi-single-crystal film 20 have a preferred orientation of <110> along a direction that is perpendicular to the stretching direction. Meanwhile, crystal grains on more than 50 percent of the area of the quasi-single-crystal film 20 are retained to have a preferred orientation of <111>.

According to the embodiment of the present invention, the mechanical stretching force F is applied in such a manner that as long as the metal film 10 can be plastically deformed by 10% or more, then the crystal grains can be rotated. Under such a condition, the preferred orientations along the stretching direction and the direction that is perpendicular to the stretching direction can be progressively retrieved.

According to the embodiment of the present invention, the crystal grain of the quasi-single-crystal film 20 has a diameter of about 1 to 5000 μm. In addition, the quasi-single-crystal film 20 may be a single layer structure or a multilayer composite structure, and a cover layer can be additionally formed upon at least one surface of the multilayer composite structure.

In the following, a manufacturing method for fabricating the nano-twins copper film of the present invention will be described in accordance to an exemplary embodiment of the present invention. First, the crystal grains aligned with the <111> crystal axis are prepared by a direct current plating method, comprising the following steps. Add a suitable surfactant, 50 g/L of sulfuric acid, and 40 ppm of hydrogen chloride (HCl) as an electrolyte in a high-purity copper sulfate ($CuSO_4$) solution. A 99.99% high-purity copper sheet is utilized as a cathode, and a silicon wafer is taken as a substrate. In the beginning, we coat polyimide as a stripping layer, and then sputter titanium having a thickness of 100 nm as an adhesion layer. After that, a [111] copper having a thickness of 200 nm is sputtered onto the adhesion layer as a seed layer, using Oerlikon ClusterLine 300 (OC Oerlikon Corporation AG, Pfaffikon, Switzerland).

The silicon wafer can be cut into a plurality of 3×12 cm² sheets and immersed in the electrolyte when being plated. The stirring rate of growing the nano-twins copper is set as 1200 r.p.m., and the current density of the direct current is 40 mA*cm⁻². The deposition rate is 12.5 nm*s⁻¹. As such, a nano-twins copper film having crystal grains in high density and arranged in a <111> orientation is obtained.

Next, the nano-twins copper film stacked along the <111> crystal axis direction is stripped off from the silicon wafer. At this time, the polyimide will be remained on the silicon wafer and the nano-twins copper film will be separated. The separated nano-twins copper film can be stretched immediately or be stretched after a less than 400 Celsius degrees annealing process. The stretching process would be performed at a room temperature and the strain rate is 0.004 (1/s). The stretching process is shown as in FIG. 2B, in which the mechanical stretching force F is applied to the nano-twins copper film, so that the nano-twins copper film can be plastically deformed and the deformation amount is up to 20%.

According to the embodiment of the separated nano-twins copper film of the present invention, an electron back-scattered diffraction, EBSD is used to examine the alignment of each crystal grain in the nano-twins copper film. Wherein, the electron back-scattered diffraction (EBSD) analysis is performed by operating a JEOL 7800F field-emission scanning electron microscope (JEOL Ltd., Tokyo, Japan) at 20 kV.

Please refer to FIGS. 3a to 3f, which show orientation image maps (OIM) of the crystals through the electron back-scattered diffraction, (EBSD) in the nano-twins copper film before and after plastic deformation employed by the stretching process in accordance with an embodiment of the present invention.

In the embodiment, the nano-twins copper film having the columnar crystal structures is subjected to the stretching force at a normal temperature or a higher temperature such that the columnar crystal structures start to rotate, and thus generate a quasi-single crystal copper film having a (111) crystal plane. The structure of the nano-twins copper film can be properly adjusted by adequate process, and its preferred surface orientation can be controlled to be a (111) crystal plane. By employing a proper amount of deformation of the nano-twins copper film, the columnar crystal structures within the film can be arranged in a much more orderly stack. The <211> orientation of the deformed quasi single crystal copper film will be aligned with the stretching direction, and the <110> orientation will be perpendicular to the stretching direction. Meanwhile, the original preferred <111> orientation of its surface would be retained to achieve the quasi single crystal structure.

As shown in FIGS. 3a to 3c, it can be seen that before the stretching process to be performed, the nano-twins copper film only has a preferred orientation of <111> on its surface, but no preferred orientations on the other two axes. To be more specific, FIG. 3a shows an analysis result of the preferred orientations of the crystal grains on the surface of the nano-twins copper film before being stretched. It is found that the surface crystal grains of the nano-twins copper film growing in the orientation of <111> crystal axis are obtained by employing the above mentioned electroplating method, and an average size of the crystal grain is about 3.1 μm. FIGS. 3b and 3c show crystal planes which are along the stretching direction and along a direction that is perpendicular to the stretching direction, respectively. It is observed that, no preferred orientations can be found before the stretching process, and the crystal planes are mainly composed of orientations of <110> and <211>.

Later, after the stretching process to be performed, as shown in FIGS. 3d to 3f, it can be seen that the nano-twins copper film retains its preferred orientation of <111> on the surface, and generates another <211> and <110> orientation on its stretching direction and the direction that is perpendicular to the stretching direction, respectively. To be more specific, FIG. 3d shows an analysis result of the preferred orientations of the crystal grains on the surface of the nano-twins copper film after being stretched. It is obvious that the stretching process does not affect the preferred <111> orientation on the surface of the nano-twins copper film. The crystal plane in the stretching direction is turned into <211> orientation as shown in FIG. 3d, and the crystal plane in the direction that is perpendicular to the stretching direction is turned into <110> orientation as shown in FIG. 3f. As a result, it is successfully proved that the preferred orientations on three axes of the present invention are accomplished.

Regarding a copper film, which is a face-centered cubic structure (FCC), the (111) crystal plane is known not being a strained-orientated crystal plane. Therefore, a copper film of quasi single crystal structure having its (111) surface could only be made through a sputtering or laser epitaxial deposition method, and so on, and due to a very slow and poor manufacturing efficiency, it could not be brought into mass production. On the contrary, nevertheless, in view of the foregoing embodiments we have provided, it is confirmed that the objective of preferred orientations on three axes can be achieved by employing the present invention when simply applying a mechanical stretching force to make it plastically deformed.

As a result, to sum up, according to the quasi single crystal film and its manufacturing method thereof, the present invention proposes to apply a mechanical stretching force to make the metal film having a <111> preferred orientation on its surface perform plastic deformation properly, such that the rotation of its crystal grains results in a much more orderly arrangement. As such, preferred orientations along the stretching direction and a direction that is perpendicular to the stretching direction are formed at the same time, whereby obtain a quasi-single crystal structure having extraordinary preferred orientations on three axes.

Moreover, since the two dimensional materials are developing very fast nowadays, for example, graphene has been applied to technical fields including transistors, biosensors, batteries, and drug coatings. Also, other two dimensional materials, such as borophene, can be produced by vapor deposition method, and the metal properties can be further applied to printed circuits boards as well. Based on these, the present invention proposes to simply apply a mechanical force so as to plastically deform the metal film, such that the objectives of having preferred orientations on three axes are successfully achieved. The proposed process is simple, rapid, low in cost, and highly efficient. Thus, it is able to meet the requirements for mass production, and can be used for manufacturing a large-area quasi single crystal film having high anisotropy as well as <111> preferred orientation on its surface. By employing the present invention, the growing of two dimensional materials or developments of other anisotropic feature structures can also be retrieved.

The embodiments described above are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention. And the present invention cover modifications and variations thereof this invention since they fall within the scope of the invention and its equivalent.

What is claimed is:

1. A quasi-single-crystal film, comprising a plurality of crystal grains which are arranged closely, wherein said crystal grains on more than 50 percent of an area of a surface of said quasi-single-crystal film have a preferred orientation of <111>, and after a mechanical stretching force is applied to a nano-twins copper film along a stretching direction such that the nano-twins copper film is plastically deformed to obtain said quasi-single-crystal film, said crystal grains on more than 50 percent of an area of said quasi-single-crystal film have a preferred orientation of <211> along said stretching direction, said crystal grains on more than 50 percent of an area of said quasi-single-crystal film have a preferred orientation of <110> along a direction that is perpendicular to said stretching direction, and said crystal grains on more than 50 percent of an area of a surface of said quasi-single-crystal film still have a preferred orientation of <111>.

2. The quasi-single-crystal film according to claim 1, wherein said crystal grains have a diameter of 1 to 5000 μm.

3. The quasi-single-crystal film according to claim 1, wherein said surface is a (111) crystal plane.

4. The quasi-single-crystal film according to claim 1, wherein said quasi-single-crystal film comprises a plurality of columnar crystal structures.

5. The quasi-single-crystal film according to claim 1, wherein said quasi-single-crystal film is a single layer structure or a multilayer composite structure.

6. The quasi-single-crystal film according to claim 5, wherein a cover layer is additionally formed upon at least one surface of said multilayer composite structure.

7. A manufacturing method for fabricating a quasi-single-crystal film, comprising:
providing a metal film, comprising a plurality of crystal grains which are arranged closely, wherein said crystal grains on more than 50 percent of an area of a surface of said metal film have a preferred orientation of <111>; and
applying a mechanical stretching force to said metal film along a stretching direction, such that said metal film is plastically deformed to obtain a quasi-single-crystal film, wherein said crystal grains on more than 50 percent of said area of said quasi-single-crystal film have a preferred orientation of <211> along said stretching direction, and said crystal grains on more than 50 percent of said area of said quasi-single-crystal film have a preferred orientation of <110> along a direction that is perpendicular to said stretching direction.

8. The manufacturing method for fabricating a quasi-single-crystal film according to claim 7, wherein said crystal grains of said quasi-single-crystal film have a diameter of 1 to 5000 μm.

9. The manufacturing method for fabricating a quasi-single-crystal film according to claim 7, wherein said surface is a (111) crystal plane.

10. The manufacturing method for fabricating a quasi-single-crystal film according to claim 7, wherein said metal film comprises a plurality of columnar crystal structures.

11. The manufacturing method for fabricating a quasi-single-crystal film according to claim 7, wherein a material of said metal film is selected from a group consisting of silver, copper, nickel, aluminum, palladium and magnesium.

12. The manufacturing method for fabricating a quasi-single-crystal film according to claim 7, wherein said mechanical stretching force is applied to make said metal film generate more than 10% plastic deformation.

* * * * *